United States Patent
Takeuchi et al.

(10) Patent No.: US 6,690,700 B2
(45) Date of Patent: Feb. 10, 2004

(54) NITRIDE SEMICONDUCTOR DEVICE

(75) Inventors: Tetsuya Takeuchi, Kanagawa (JP); Yawara Kaneko, Chigasaki (JP); Norihide Yamada, Tokyo (JP); Hiroshi Amano, Aichi (JP); Isamu Akasaki, Aichi (JP)

(73) Assignee: Agilent Technologies, Inc., Palo Alto, CA (US)

( * ) Notice: Subject to any disclaimer, the term of this patent is extended or adjusted under 35 U.S.C. 154(b) by 139 days.

(21) Appl. No.: 09/833,243

(22) Filed: Apr. 10, 2001

(65) Prior Publication Data

US 2001/0038656 A1 Nov. 8, 2001

Related U.S. Application Data

(63) Continuation of application No. PCT/US99/24146, filed on Oct. 14, 1999.

(51) Int. Cl.[7] ............................................... H01S 5/00
(52) U.S. Cl. ............................ 372/45; 372/43; 372/44
(58) Field of Search ........................ 372/43–50; 438/509, 438/40, 46, 33; 117/95; 257/453

(56) References Cited

U.S. PATENT DOCUMENTS

| | | | | |
|---|---|---|---|---|
| 4,614,961 A | * | 9/1986 | Khan et al. | 257/453 |
| 4,855,249 A | * | 8/1989 | Akasaki et al. | 117/95 |
| 5,656,832 A | * | 8/1997 | Ohba et al. | 372/50 |
| 5,798,537 A | | 8/1998 | Nitta | 257/103 |

FOREIGN PATENT DOCUMENTS

| | | |
|---|---|---|
| EP | 0678945 A | 10/1995 |
| EP | 0723303 A | 7/1996 |
| EP | 0772249 A | 5/1997 |
| JP | 10256662 | 9/1998 |
| JP | 10261816 | 9/1998 |
| JP | 10261838 | 9/1998 |
| JP | 10242587 | 9/1999 |

OTHER PUBLICATIONS

K. Ito et al. "Preparation of $Al_xGa_{1-x}N/GaN$ Heterostructure by MOVPE", Journal of Crystal Growth, vol. 104, 1990, pp. 533–538, (no month).

S. Nakamura et al., "InGaN/GaN/AlGan–based Laser Diode with Modulation–Doped Strained–Layer Superlatives Grown on an Epitaxially Laterally Overgrown GaN Substrate", Applied Physics Letters, vol. 72, 1998, pp. 211–213, Jan. 1998.

D. Hofstetter et al., "Excitation of a Higher Order Transverse Mode in an Optically Pumped $In_{0.15}Ga_{0.85}N/In_{0.095}Ga_{0.95}N$ Multiquantum Well Laser Structure", Applied Physics Letters, vol. 70, 1997, pp. 1650–1652, Mar. 1997.

Y. Ohba, "Fabrication and characterization of AlGaN/GaN Double–Heterolaser Structures on Sapphire Substrates Using Single Crystalline AlN Buffer Lasers", Japan Journal of Applied Physics, vol. 379, 1998, pp. L905–906, Aug. 1998.

* cited by examiner

*Primary Examiner*—Quyen Leung
(74) *Attorney, Agent, or Firm*—Ian Hardcastle

(57) ABSTRACT

A nitride semiconductor device that comprises a first layer, a second layer and a buffer layer sandwiched between the first layer and the second layer. The second layer is a layer of a single-crystal nitride semiconductor material including AlN and has a thickness greater than the thickness at which cracks would form if the second layer were grown directly on the first layer. The buffer layer is a layer of a low-temperature-deposited nitride semiconductor material that includes AlN. Incorporating the nitride semiconductor device into a semiconductor laser diode enables the laser diode to generate coherent light having a far-field pattern that exhibits a single peak.

20 Claims, 4 Drawing Sheets

NITRIDE SEMICONDUCTOR DEVICE

This application is a continuation of pending International Application No. PCT/US99/24146, International Filing Date Oct. 14, 1999.

BACKGROUND OF THE INVENTION

Short-wavelength lasers fabricated from Group III-nitride semiconductor materials, whose general formula is $Al_xGa_{1-x-y}In_yN$, where Al is aluminum, Ga is gallium, In is indium, N is nitrogen, and x and y are compositional ratios, have been widely reported. However, such lasers have a far-field pattern, which is the Fourier transformation of the near-field pattern, that exhibits more than one peak. See, for example, D. Hofstetter et al., 70 APPL. PHYS. LETT., 1650 (1997). A laser that generates coherent light having a far-field pattern that exhibits multiple peaks can be used in substantially fewer practical applications than a laser that generates coherent light having a far-field pattern that exhibits a single peak.

The far-field pattern of the light generated by such conventional lasers exhibits multiple peaks, rather than the desired single peak, because the optical waveguide layer provides insufficient optical confinement and allows light to leak from the optical waveguide layer into the contact layer underlying the cladding layer. The contact layer then acts as a parasitic optical waveguide, resulting in spurious laser oscillation in a high-order mode. The contact layers are included in the laser to inject current into the active layer.

Attempts to achieve sufficient optical confinement have included increasing the thickness of the cladding layers compared with the conventional thickness value, and increasing the refractive index difference between the cladding layers and the optical waveguide layers. However, when implemented conventionally, these measures cause cracks in the cladding layers. This seriously impairs the production yield of lasers that incorporate such measures.

Figure 1:
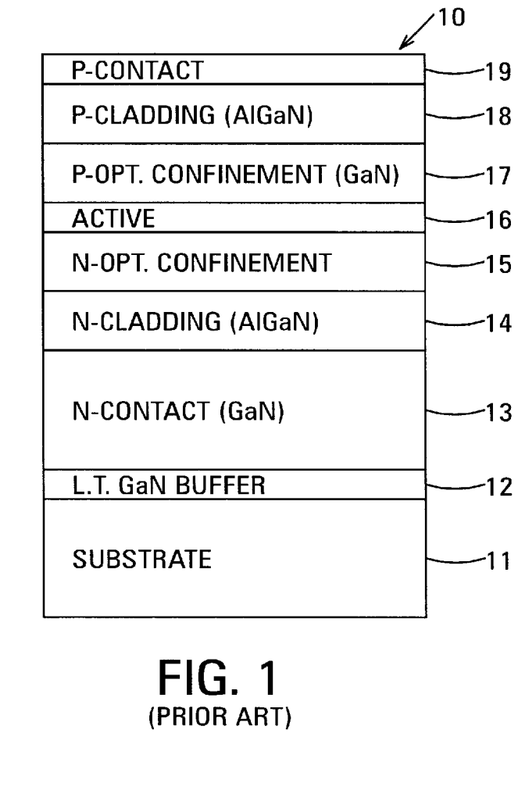
FIG. 1 is a schematic drawing showing the structure of a conventional GaN-based laser diode.

FIG. 1 illustrates the structure of the conventional GaN-based laser diode 10. The electrodes have been omitted to simplify the drawing. The laser diode is composed of the GaN low-temperature-deposited buffer layer 12, the GaN n-contact layer 13, the n-type AlGaN cladding layer 14, the n-type GaN optical waveguide layer 15, the active layer 16, the p-type GaN optical waveguide layer 17, the p-type AlGaN cladding layer 18, and the GaN p-contact layer 19. These layers are successively grown on the substrate 11. The material of the substrate is sapphire, SiC, spinel, MgO, GaAs, silicon, or some other suitable material.

The growth temperatures and growth thicknesses of the layers of a conventional laser diode having a structure similar to that shown in FIG. 1 are disclosed by Okumura in Japanese Laid-Open Patent Application No. H 10-261838. The low-temperature-deposited buffer layer 12 is a 35 nm-thick layer of GaN deposited at a temperature of 550° C. The GaN n-contact layer 13 is a 3 µm-thick layer of silicon-doped n-type GaN deposited at a temperature of 1050° C. The n-type cladding layer 14 is a 700 nm-thick layer of silicon-doped $Al_{0.1}Ga_{0.9}N$ deposited at a temperature of 1050° C. The n-type optical waveguide layer 15 is a 50 nm-thick layer of silicon-doped GaN deposited at a temperature of 1050° C. The active layer 16 is an 18 nm-thick composite layer deposited at a temperature of 750° C. The composite layer is composed of three 2 nm-thick layers of $In_{0.05}Ga_{0.95}N$ interleaved with four 3 nm-thick layers of $In_{0.2}Ga_{0.8}N$. The laser diode additionally includes an anti-evaporation layer (not shown), which is a 10 nm-thick layer of $Al_{0.2}Ga_{0.8}N$ deposited at a temperature of 750° C. The p-type optical waveguide layer 17 is a 50 nm-thick layer of magnesium-doped GaN deposited at a temperature of 1050° C. The p-type cladding layer 18 is a 700 nm-thick layer of magnesium-doped $Al_{0.1}Ga_{0.9}N$ deposited at a temperature of 1050° C. The p-contact layer 19 is a 200 nm-thick layer of magnesium-doped p-type GaN deposited at a temperature of 1050° C.

The above-mentioned layers are successively grown on the C plane of the sapphire substrate 11 by metal-organic vapor phase epitaxy (MOVPE). Alternatively, molecular beam epitaxy (MBE) or halide vapor phase epitaxy (HVPE) may be used.

After the above-described stack of layers has been deposited on the substrate, the stack of layers is annealed at 800° C. in a nitrogen atmosphere to activate the dopants in the magnesium-doped p-type layers, and hence reduce the resistance of these layers. It has also been disclosed that the $Al_{0.2}Ga_{0.8}N$ anti-evaporation layer (not shown) can be doped with magnesium, which facilitates hole injection from the p-type GaN optical waveguide layer 17.

Okumura reported that providing a ridge structure in the stack, depositing electrodes on the p-contact layer 19 and the n-contact layer 13 and cleaving the stack produced a laser diode that generated coherent light with a wavelength of 430 nm and had a threshold current of 40 mA.

Okumura's disclosure does not indicate the far-field pattern of the light emitted by the laser just described.

In 37 JPN. APPL. PHYS., L905–L906 (1998), Yasuo Ohba et al. proposed a structure that uses a GaN active layer for generating light at short wavelengths. The GaN active layer required that the molar fraction of AlN in the AlGaN cladding layers be increased to maintain the band-gap difference between the active layer and the cladding layers. However, the increased aluminum molar fraction gave rise to a lattice mismatch between the materials of the AlGaN cladding layer and the GaN buffer layer on which it was deposited. The lattice mismatch was sufficiently large to cause cracks in the cladding layer.

Ohba et al. disclosed using a single-crystal AlN buffer layer interposed between the substrate and the n-type cladding layer to solve the cracking problem. First, a 600 nm-thick single-crystal AlN buffer layer was grown at a temperature of 1300° C. on a sapphire substrate. Successively grown on the buffer layer were an n-type cladding layer, which was a 1.2 µm-thick layer of silicon-doped n-type $Al_{0.25}Ga_{0.75}N$ deposited at a temperature of 1150° C.; an n-type optical waveguide layer, which was a 100 nm-thick layer of silicon-doped GaN deposited at a temperature of 1150° C.; an active layer, which was a 50 nm-thick composite layer composed of one layer of $Al_{0.2}Ga_{0.8}N$, five layers of GaN interleaved with four layers of $Al_{0.1}Ga_{0.9}N$ and one layer of $Al_{0.2}Ga_{0.8}N$; a p-type optical waveguide layer, which was a 100 nm-thick layer of magnesium-doped GaN grown at a temperature of 1150° C.; a p-type cladding layer, which was a 700 nm-thick layer of magnesium-doped $Al_{0.25}Ga_{0.75}N$ grown at a temperature of 1150° C.; and p-contact layer, which was a 600 nm-thick layer of magnesium-doped GaN contact layer grown at a temperature of 1150° C.

After the above-stack of layers was deposited, the stack was annealed in a nitrogen atmosphere at 800° C. to activate the dopants in the magnesium doped p-type layers, and hence reduce the resistance of these layers. Ohba et al. reported that no cracking was observed even when the n-type cladding layer was grown on the single-crystal AlN buffer layer to an overall thickness of 1.8 μm. According to Ohba et al., p-type AlGaN has a reasonably low resistivity at AlN molar fractions up to 25%. Ohba et al. further reported that, when electrodes were added to the device just described, the device emitted high-intensity light, but no coherent light was generated, even near the breakdown voltage of the device.

In Japanese Laid-Open Patent Application No. H 10-242587, Nagahama et al. stated: "In the case of an LD (laser diode), a cladding layer that provides optical confinement must be grown preferably with a thickness of at least 0.1 μm, but if a thick AlGaN layer is grown directly on GaN and AlGaN layers, cracks will develop in the AlGaN layer that is subsequently grown. This has made device production difficult in the past." Nagahama et al. went on to disclose a technique that introduced a 10 to 500 nm-thick anti-cracking layer on which a layer can be grown thick enough for the subsequently-grown aluminum-containing layer to function as a cladding layer. Nagahama et al. stated that, while the anti-cracking layer can be left out under certain conditions, such as when certain growth conditions are used for growing the cladding layer, it should be included if an LD is being produced.

Nagahama et al. further disclosed an n-type cladding layer formed on the anti-cracking layer. The n-type cladding layer was a nitride semiconductor containing aluminum, preferably AlGaN. The thickness of the cladding layer was between 10 nm and 2 μm, and was preferably between 50 nm and 1 μm. In a working example, the n-type anti-cracking layer was an approximately 50 nm-thick layer of silicon-doped $In_{0.1}Ga_{0.9}N$ grown at 800° C., and the n-type cladding layer was a 500 nm-thick layer of silicon-doped $Al_{0.2}Ga_{0.8}N$ grown at 1030° C.

Nagahama et al. disclosed nothing about the far-field pattern of the coherent light emitted by a laser diode incorporating the structure just described.

In Japanese Laid-Open Patent Application No. H 10-256662, Ozaki et al. disclosed a cladding layer having a superlattice structure formed on an anti-cracking layer. In a working example, the n-type anti-cracking layer was an approximately 50 nm-thick layer of silicon-doped $In_{0.1}Ga_{0.9}N$ grown at a temperature of 800° C., and the n-type cladding layer was a 400 nm-thick superlattice multi-layer structure composed of 100 layers of silicon-doped GaN, each 2 nm thick, interleaved with 101 layers of silicon-doped $Al_{0.2}Ga_{0.8}N$. It was claimed that the crystal quality of the n-type cladding layer was extremely good because the thickness of the layers was below the critical thickness within the limit of elastic deformation.

Ozaki et al. disclosed nothing about the far-field pattern of the coherent light emitted by a laser diode incorporating the structure just described.

In Japanese Laid-Open Patent Application No. H 10-261816, Kuramata disclosed a technique in which a 1 μm-thick layer of AlGaN was grown as a cladding layer directly on a substrate of 6H-SiC (0001) C. The material of the cladding layer was silicon-doped $Al_{0.1}Ga_{0.9}N$ grown at 1200° C. Kuramata additionally disclosed a structure in which an undoped 20 nm-thick layer of AlN and a 1 μm-thick layer of n-type GaN were deposited at 1200° C. as buffer layers on a SiC substrate, and a 200 nm-thick layer of silicon-doped $Al_{0.1}Ga_{0.9}N$ was grown on the GaN layer as a cladding layer.

Kuramata disclosed nothing about the far-field pattern of the coherent light emitted by a laser diode incorporating the structure just described.

What is needed, therefore, is an efficient nitride semiconductor device, suitable for incorporation into a laser diode, that would permit the laser diode to generate coherent light having a far-field pattern that exhibits a single peak. Incorporating the nitride semiconductor device into a laser diode should enable the cladding layers of the laser diode to provide an increased optical confinement so that unintended light leakage from the optical waveguide region to the underlying contact layer is reduced. The optical confinement can be increased by increasing the thickness of the AlGaN material of the cladding layers, by increasing the molar fraction of AlN in the AlGaN of the cladding layers, or both. However, these measures have traditionally led to cracks in the cladding layers and, hence, poor device performance and poor production yields. The above-mentioned prior art provides no clear design guidelines as to how to enhance the optical waveguide provided by the cladding layers without the disadvantages just described.

The results reported by Ohba et al. indicate that cladding layers that are too thick, and incorporating an AlN buffer layer, may prevent a device having the structure of a laser diode from generating coherent light even though the layers do not have cracks. Also, since the lattice mismatch between AlGaN and GaN generates cracks and other defects, a thick, crack-free AlGaN cladding layer that provides sufficient confinement cannot be grown directly on a layer of GaN using conventional techniques. It is difficult to prevent a thick cladding layer of single-crystal AlGaN from cracking, even when the cladding layer is grown on an anti-cracking layer. Therefore, even when an anti-cracking layer is used, the AlGaN cladding layer have to have a superlattice structure, or other measures have to be taken. These measures, however, make the structure complicated, and lead to an unsatisfactory production yield.

What also is needed, therefore, is a nitride semiconductor device that can be incorporated into a semiconductor laser diode that generates short-wavelength coherent light having a far-field pattern that exhibits a single peak. The nitride semiconductor device should also have a simple structure, and the laser diode that incorporates the nitride semiconductor device should have a high efficiency, high reliability, and a long service life.

SUMMARY OF THE INVENTION

The invention provides a nitride semiconductor device that includes a first layer of a first material and a second layer of a single-crystal nitride semiconductor material that includes AlN. The second layer has a thickness greater than the thickness at which cracks would form if the second layer were grown directly on the first layer. Sandwiched between the first layer and the second layer is a buffer layer of a low-temperature-deposited nitride semiconductor material that includes AlN. The low-temperature-deposited nitride semiconductor material of the buffer layer is deposited at a temperature below that at which single-crystal growth occurs.

The nitride semiconductor device according to the invention, when incorporated into a laser diode, lowers the threshold current of the laser diode, and enables the laser diode to generate coherent light having a far-field pattern that exhibits a single peak. The nitride semiconductor device according to the invention enables the laser diode to include cladding layers that effectively confine light without being subject to cracking.

In the nitride semiconductor device according to the invention, the thickness of the second layer, or the AlN molar fraction of the single-crystal nitride semiconductor material of the second layer, or both, are greater than a value at which the coherent light emitted by the laser diode has a far-field pattern that exhibits a single peak.

The first layer on which the above-mentioned buffer layer is grown can be a layer of GaN or a substrate. The material of the substrate can be sapphire, SiC, silicon, $MgAl_2O_4$, GaN or some other suitable substrate material. The ability of the first layer to be a layer of GaN or a substrate enables one or more nitride semiconductor devices according to the invention to be incorporated into a semiconductor device at a location or locations where the elements can prevent cracking. Each nitride semiconductor device enables a thick, crack-free second layer of a material that includes AlN to be grown over a first layer of a material having a lattice constant different from the material of the second layer with the buffer layer sandwiched between them. Consequently, lasers and other semiconductor devices that incorporate the nitride semiconductor device according to the invention can have good performance characteristics and low manufacturing cost.

In an embodiment, the above-mentioned first layer of GaN is grown on a substrate on which has been deposited a buffer layer of low-temperature-deposited nitride semiconductor material. The buffer layer improves the surface quality of the first layer of GaN grown on it.

The buffer layer and the second layer may be doped with the same type of dopant. This reduces the resistance of the buffer layer and enhances the efficiency of the nitride semiconductor device.

To minimize the resistivity of the buffer layer, the doping concentration of the buffer layer of low-temperature-deposited nitride semiconductor material should be as high as possible, but less than that which degrades the crystal quality of the low-temperature-deposited nitride semiconductor material of the buffer layer.

Silicon, germanium, and the like can be used as n-type dopants, while magnesium, zinc, and beryllium can be used as p-type dopants. Silicon and magnesium have the effect of lowering resistance and allow technologically-mature fabrication methods to be used.

The thickness of the buffer layer should be at least that at which the buffer layer provides a stable buffering effect. However, the thickness should be no more than that at which a good crystal quality is maintained in the buffer layer itself and in the second layer grown on the buffer layer. Therefore, the thickness of the buffer layer should be in the range of 2 nm to 100 nm.

In an embodiment, the buffer layer has a thickness in the range from 20 to 40 nm, and the low-temperature deposited material that includes AlN is $Al_yGa_{1-y}N$ ($0<y\leq1$). The second layer has a thickness of at least 600 nm, and the single-crystal nitride semiconductor material that includes AlN is $Al_xGa_{1-x}N$ ($0.05<x\leq1$). With these materials and thicknesses, and when the molar fraction of AlN in the single-crystal nitride semiconductor material is at least 10%, a semiconductor laser incorporating the nitride semiconductor device according to the invention generates coherent light having a far-field pattern that exhibits a single-peak characteristic.

The molar fraction of AlN in the low-temperature-deposited nitride semiconductor material of the buffer layer is at least 5% to prevent cracking of the second layer. Increasing the AlN molar fraction increases the resistivity of the buffer layer. However, to prevent cracking, the AlN molar fraction in the low-temperature-deposited nitride semiconductor material should be the same as or greater than that of the single-crystal nitride semiconductor material of the second layer. Making the AlN molar fractions the same in both the buffer layer and the second layer is one choice.

Although other growth methods can be used, growing the buffer layer and the second layer using metal-organic vapor phase epitaxy produces a nitride semiconductor device that, when incorporated in a semiconductor laser, enables the laser to generate coherent light having a far-field pattern that exhibits a single peak.

The invention also provides a method of making a nitride semiconductor device. In the method, a first layer is provided, and a buffer layer of a nitride semiconductor material including AlN is deposited on the first layer at a temperature below that at which single-crystal growth occurs. A second layer of a single-crystal nitride semiconductor material including AlN is grown on the buffer layer at a temperature above that at which single-crystal growth occurs. The second layer is grown to a thickness greater than a thickness at which cracks would form if the second layer were grown directly on the first layer.

DETAILED DESCRIPTION OF THE INVENTION

In the conventional laser diode 10 shown in FIG. 1, cracks form in the n-type AlGaN cladding layer 14 when the AlN molar fraction in the material of the cladding layer 14 is sufficiently high to cause a lattice mismatch between the material of the cladding layer 14 and that of the n-type GaN contact layer 13 underlying the cladding layer, and the thickness of the cladding layer 14 exceeds the critical thickness. Similarly, cracks form in the p-type AlGaN cladding layer 18 when the AlN molar fraction in the material of the cladding layer 14 is sufficiently high to cause a lattice mismatch between the material of the cladding layer 18 and that of the p-type GaN optical waveguide layer 17 underlying the cladding layer 18, and the thickness of the cladding layer 18 is greater than the critical thickness. Cracks greatly decrease the yield in manufacturing a semiconductor device, such as the laser diode 10, having the structure shown in FIG. 1.

To avoid cracking in the conventional laser diode 10, one or both of the following conditions must be met: the AlGaN cladding layers 14 and 18 must have a thickness of less than 500 nm; and the materials of these layers must have an AlN molar fraction of less than 5%. However, a laser diode whose cladding layers meet these conditions will generate coherent light having a far-field pattern that exhibits multiple peaks. Such a far-field pattern indicates that the optical confinement of the laser diode is inadequate, and, in particular, that the optical confinement is insufficient to prevent light from leaking into the n-type GaN contact layer 13. The optical confinement factor of the laser diode 10 is about 2.5%.

The inventors hypothesized that a possible solution to the problems just described would be to increase the maximum thickness of the cladding layers and the maximum AlN molar fraction of the materials of the cladding layers, and therefore improve the optical confinement. The inventors further hypothesized that their proposed changes to the cladding layers could be accomplished without causing cracks in the cladding layers by sandwiching a buffer layer of a low-temperature-deposited nitride semiconductor material that includes AlN between the AlGaN cladding layers and the GaN layers underlying them, i.e., between the n-type AlGaN cladding layer and the n-type GaN contact layer and between the p-type AlGaN cladding layer and the p-type GaN optical waveguide layer.

To test their hypothesis, the inventors had three test samples fabricated. The test samples were composed of a 1 μm-thick layer of single-crystal AlGaN with an AlN molar fraction of 10% grown on a GaN substrate. In the first test sample, the 1 μm-thick AlGaN layer was grown directly on the GaN substrate without any kind of buffer layer. In the second test sample, the AlGaN layer was grown on a 30 nm-thick buffer layer of low-temperature-deposited GaN semiconductor material. The GaN buffer layer was deposited on the GaN substrate at a temperature of 500° C., which is below the temperature at which single-crystal growth occurs in GaN. In the third test sample, the AlGaN layer was grown on a 30 nm-thick buffer layer of low-temperature-deposited nitride semiconductor material that includes AlN. The AlN-including buffer layer was deposited on the GaN substrate at a temperature of 500° C., which is below the temperature at which single-crystal growth occurs in AlN.

Photomicrographs were taken of the surface of the AlGaN layer of the test samples. The photomicrographs showed numerous cracks in the surface of the AlGaN layer of the first and second test samples, whereas the surface of the AlGaN layer of the third test sample having the buffer layer of low-temperature-deposited nitride semiconductor material that includes AlN was free of cracks.

Further investigations showed that there was a significant reduction in cracks in the AlGaN layer when the low-temperature-deposited nitride semiconductor material of the buffer layer was AlGaN with an AlN molar fraction of at least 5%.

The layer on which the buffer layer of low-temperature-deposited nitride semiconductor material that includes AlN was deposited need not be a GaN substrate or a GaN layer. The buffer layer of low-temperature-deposited nitride semiconductor material that includes AlN can provide the same benefit when deposited on sapphire, SiC, or some other material other than a nitride semiconductor. For instance, it was found that almost no cracking occurred in a layer of AlGaN up to 5 μm thick with an AlN molar fraction of 20% when the layer was grown on a buffer layer of low-temperature-deposited nitride semiconductor material that includes AlN that was in turn deposited on a sapphire substrate instead of the above-mentioned layer of GaN.

In another experimental verification, the process that will be described below with reference to FIG. 2 was performed to form test samples having an n-type AlGaN cladding layer with an AlN molar fraction of 10% deposited on a buffer layer on a (0001) C sapphire substrate. Test samples in which the AlN molar fraction of the buffer layer of low-temperature-deposited AlGaN semiconductor material was 0% (i.e., GaN), 20%, 40%, and 100% (i.e., AlN) were fabricated. Photomicrographs of the surface of the n-type AlGaN cladding layer of the test samples were taken. The photomicrographs of the test sample in which the AlN molar fraction of the buffer layer was zero, i.e., the buffer layer was GaN, showed many cracks in the cladding layer, whereas the cladding layers of the other three test samples were crack free. This showed that the AlN molar fraction of the low-temperature deposited material of the buffer layer should be equal to or greater than that of single-crystal material of the cladding layer to prevent cracks in the cladding layer.

Figure 2:
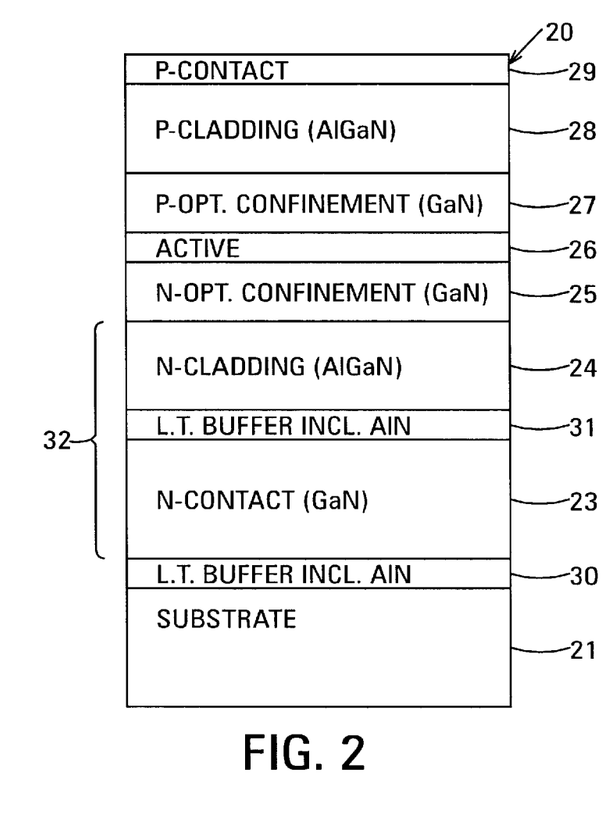
FIG. 2 is a schematic drawing showing the structure of a first embodiment of a laser diode incorporating the nitride semiconductor device according to the invention.
Figure 3:
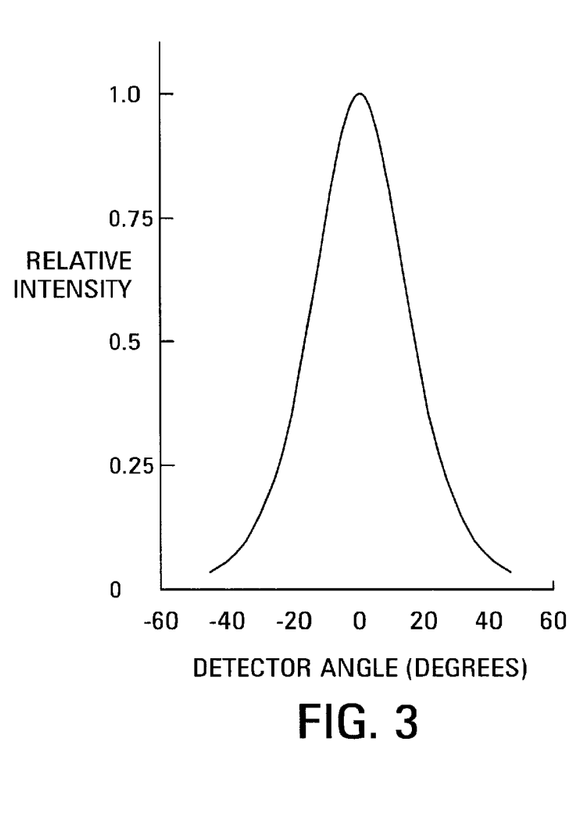
FIG. 3 is a graph showing the far-field pattern of the coherent light generated by a laser diode incorporating the nitride semiconductor device according to the invention.

FIG. 2 illustrates the structure of a first embodiment of a laser diode incorporating a nitride semiconductor device according to the invention. The laser diode includes the nitride semiconductor device 32 composed of the buffer layer 31 of low-temperature-deposited nitride semiconductor material that includes AlN sandwiched between the 5 μm-thick GaN n-contact layer 23 and the 1 μm-thick n-type $Al_{0.1}Ga_{0.9}N$ cladding layer 24. FIG. 3 shows the far-field pattern of the coherent light emitted by a semiconductor laser incorporating the laser diode 20. In FIG. 3, the rotational angle of the laser diode with respect to the photodetector is plotted along the x-axis, and the optical intensity is plotted along the y-axis. The far-field pattern exhibits a single peak, which indicates that the laser diode 20 has an optical confinement factor of greater than 4%. This is substantially greater than the optical confinement factor of the conventional laser diode 10 shown in FIG. 1.

In the laser diode 20 shown in FIG. 3, the buffer layer 30 of low-temperature-deposited nitride semiconductor material is a 30 nm-thick layer of AlGaN deposited at a temperature of 500° C. The n-contact layer 23 is a 5 μm-thick layer of silicon-doped GaN grown at a temperature of 1050° C. The buffer layer 31 of low-temperature-deposited nitride semiconductor material that includes AlN is a 30 nm-thick layer of silicon-doped n-type $Al_{0.1}Ga_{0.9}N$ deposited at a temperature of 500° C. The n-type cladding layer 24 is a 1 μm-thick layer of silicon-doped $Al_{0.1}Ga_{0.9}N$ grown at a temperature of 1050° C. The n-type optical waveguide layer 25 is a 100 nm-thick layer of silicon-doped GaN grown at a temperature of 1050° C. The active layer 26 is a 51 nm-thick composite layer grown at a temperature of 800° C. The composite layer is composed of five 3 nm-thick layers of $Ga_{0.9}In_{0.1}N$ interleaved with six 6 nm-thick layers of GaN. The p-type optical waveguide layer 27 is a 100 nm-thick layer of magnesium-doped GaN grown at a temperature of 1050° C. The p-type cladding layer 28 is a 1 μm-thick layer of magnesium-doped $Al_{0.1}Ga_{0.9}N$ grown at a temperature of 1050° C. The p-type contact layer 29 is a 200 nm-thick layer of magnesium-doped GaN grown at a temperature of 1050° C. The above-mentioned layers are successively grown or deposited on the C plane of the sapphire substrate 21 by metal-organic vapor phase epitaxy (MOVPE).

The buffer layer 31 is fabricated from a nitride semiconductor material that includes AlN. The buffer layer is deposited at a temperature below that at which single-crystal growth occurs. After it is deposited, the material of the buffer layer is therefore a mixture of amorphous and polycrystalline material. Raising temperature of the substrate and the buffer layer to a temperature above that at which single-crystal growth occurs to grow the cladding layer 24 anneals the low-temperature deposited material of the buffer layer, and causes single-crystal regions to develop in the buffer layer. As a result, the cladding layer grows epitaxially on the buffer layer. However, regions of residual polycrystalline, amorphous, or polycrystalline and amorphous material distinguish the buffer layer of low-temperature-deposited nitride semiconductor material from the layers single-crystalline nitride semiconductor material between which the buffer layer is sandwiched in the finished nitride semiconductor device and in the finished laser diode based on the nitride semiconductor device.

The material of the substrate 21 in this first embodiment and in other embodiments to be described below is sapphire. Sapphire substrates have been well researched and are quite inexpensive. Silicon carbide (SiC) may alternatively be used as the substrate. SiC substrates are more expensive, but they have a lower specific resistance, are more stable, and have better cleaving properties.

The process for fabricating the laser diode 20 will now be described in detail. The sapphire substrate 21 with a (0001) C plane on which will be grown the stack of layers from which the laser diode 20 will be fabricated was etched by dipping it for 5 minutes each in hydrofluoric acid and aqua regia, and then was rinsed for 5 minutes in pure water. Organic washing was then performed with methanol and acetone for 5 minutes each, after which the substrate was again rinsed in pure water.

The above processing was performed at room temperature. The sapphire substrate 21 was then installed in the reactor of a metal-organic vapor phase epitaxy (MOVPE) apparatus. The atmosphere in the reactor was thoroughly replaced with nitrogen to remove oxygen and water from the reactor. Hydrogen was then introduced and the sapphire substrate was subject to hot cleaning for 10 minutes at 1100° C.

The temperature of the sapphire substrate 21 was the reduced to 500° C., and trimethylaluminum (TMAl) and ammonia were supplied to the reactor for approximately 3 minutes to deposit the 30 nm-thick buffer layer 30 of low-temperature-deposited AlN semiconductor material on the sapphire substrate 21.

The temperature of the sapphire substrate 21 was then raised to 1050° C., trimethylgallium (TMGa), ammonia, and silane were supplied to the reactor to grow the GaN n-contact layer 23. The supplies of TMGa and silane were halted after the n-contact layer reached a thickness of 5 µm. The growth rate was 2.5 µm per hour. The n-contact layer 23 had a silicon dopant concentration of $2 \times 10^{18}$ cm$^{-3}$. A higher silicon concentration would decrease the specific resistance of the n-type GaN, but would also degrade the crystal quality. The silicon concentration may be in the range from $5 \times 10^{17}$ cm$^{-3}$ to $1 \times 10^{19}$ cm$^{-3}$. In an embodiment, the silicon concentration was $2 \times 10^{18}$ cm$^{-3}$.

The temperature of the sapphire substrate 21 was again lowered to 500° C., during which time the supply of ammonia was continued. Once the temperature of the sapphire substrate 21 reached 500° C., TMGa and TMAl were supplied to the reactor to deposit the buffer layer 31 of low-temperature-deposited AlGaN semiconductor material to a thickness of 30 nm. The deposition rate was 10 nm per minute. Silane may also be supplied simultaneously to dope the AlGaN with silicon at a concentration in the range from about $5 \times 10^{17}$ cm$^{-3}$ to $5 \times 10^{19}$ cm$^{-3}$. Doping the buffer layer 31 improves the conductivity of this layer. In this example, the concentration of the silicon dopant was $2 \times 10^{18}$ cm$^{-3}$. As a result, the resistivity of the buffer layer 31 was sufficiently low to allow enough current to flow to drive of the laser diode 20.

Upon completion of the growth of the buffer layer 31, the supplies of TMAl, TMGa, and silane were halted.

Approximately 5 minutes after the supplies of TMAl, TMGa, and silane were halted, the temperature of the sapphire substrate 21 was raised to 1050° C. Once the temperature of the substrate reached 1050° C., the supplies of TMGa, TMAl, and silane were recommenced to grow the n-type AlGaN cladding layer 24. Because the n-type AlGaN cladding layer 24 was grown on the buffer layer 31 instead of directly on the n-contact layer 23, the AlGaN cladding layer 24 could be grown to a thickness of 1 µm with an AlN molar fraction of 10% without any cracks occurring. The n-type cladding layer may be doped with silicon at a concentration in the range from about $5 \times 10^{17}$ cm$^{-3}$ to $1 \times 10^{19}$ cm$^{-3}$. In this example, the concentration of the silicon dopant was $2 \times 10^{18}$ cm$^{-3}$. When the cladding layer 24 reached its desired thickness, the supply of only the TMAl was halted.

The temperature of the sapphire substrate 21 was held at 1050° C., and the supplies of TMGa and silane were continued to grow the n-type GaN optical waveguide layer 25 to a thickness of 100 nm. The growth conditions were the same as for the n-type GaN n-contact layer 23.

The buffer layer 31, the GaN-contact layer 23, the n-type AlGaN cladding layer 24, and the n-type GaN optical waveguide layer 25 may have different dopant concentrations, or some of them may have the same concentration. However, the procedure is simpler when all of the layers are designed to have more or less the same dopant concentration.

The temperature of the sapphire substrate 21 was next lowered to 800° C. TMGa alone, and TMGa together with trimethylindium (TMIn), were alternately supplied to the reactor to grow the active layer 26. The active layer is a composite layer composed of multiple quantum well layers. The active layer was formed by growing a GaN layer to a thickness of 6 nm followed by a $Ga_{0.9}In_{0.1}N$ layer grown to a thickness of 3 nm. This process was repeated five times. Finally, a GaN layer was grown to a thickness of 6 nm. The molar fraction of InN in the $Ga_{0.9}In_{0.1}N$ determines the wavelength of the light generated by the laser diode 20. A molar fraction of 10% corresponds to a wavelength of 400 nm in this example. A growth rate in the range from 3 to 6 nm per minute is satisfactory. In this example, the growth rate was 5 nm per minute and the total thickness of the active layer was 51 nm. When growth of the active layer 26 was finished, the supplies of TMGa and TMIn were halted.

The temperature of the sapphire substrate 21 was raised to 1050° C., and TMGa and Cp2Mg (biscyclopentadienylmagnesium) were supplied to the reactor to grow the p-type GaN optical waveguide layer 27 to a thickness of 100 nm. The growth rate was 2 µm per hour. The magnesium concentration was in the range from $1 \times 10^{18}$ cm$^{-3}$ to $1 \times 10^{20}$ cm$^{-3}$. In an embodiment, the magnesium concentration was approximately $5 \times 10^{19}$ cm$^{-3}$. Just as with silicon, too high a concentration of magnesium will degrade the crystal quality, so care must be taken in choosing the concentration of the magnesium dopant.

When the p-type optical waveguide layer 27 reached its design thickness, the substrate temperature was maintained at 1050° C., and TMAl was additionally supplied to the reactor to grow the p-type AlGaN cladding layer 28 to a thickness of 1 μm. The magnesium concentration in this layer may be in the range from $1 \times 10^{18}$ cm$^{-3}$ to $1 \times 10^{20}$ cm$^{-3}$. In an embodiment, the magnesium concentration was approximately $5 \times 10^{19}$ cm$^{-3}$. When the p-type cladding layer 28 reached its design thickness, the supply of the TMAl was halted.

The magnesium dopant concentrations in the p-type GaN optical waveguide layer 27 and the p-type AlGaN cladding layer 28 may differ, but fabrication is simpler if they are the same. The concentration may be in the range from $1 \times 10^{18}$ cm$^{-3}$ to $1 \times 10^{20}$ cm$^{-3}$. In an embodiment, the magnesium concentration was approximately $5 \times 10^{19}$ cm$^{-3}$, as noted above.

When the p-type cladding layer 28 reached its design thickness, the temperature of the sapphire substrate 21 was maintained at 1050° C. and the supply of the TMAl was halted to grow the GaN p-contact layer 29 to a thickness of 200 nm. The growth rate was 2.5 μm per hour. In an embodiment, the magnesium concentration in this layer was approximately $1 \times 10^{20}$ cm$^{-3}$.

When the p-type contact layer reached its design thickness, the supplies of TMGa and Cp2 Mg were halted and the temperature of the sapphire substrate 21 was lowered. When the substrate temperature dropped below 100° C., the supply of ammonia was halted, and the sapphire substrate on which the above-described stack of layers had been grown was taken out of the reactor. Microscope observation of the surface of the stack indicated that no cracking had occurred.

The stack was then selectively etched to expose the surface of the n-type GaN n-contact layer 23 or the n-type AlGaN cladding layer 24. A layer of metal was deposited on the exposed surface by vapor deposition to provide the n-electrode (not shown). In this example, an electrode of titanium/aluminum (Ti/Al) was formed on the exposed n-type GaN surface using conventional techniques. Depositing the n-electrode on the n-type AlGaN cladding layer 24, which is closer to the p-type layers, instead of the n-type GaN n-contact layer 23, reduces the resistance of the laser diode 20.

A ridge structure was formed to provide current confinement. To activate the dopant in the magnesium-doped layers, a conventional thermal annealing or an electron beam irradiation treatment was performed. A 5 μm-thick layer of nickel and gold with a length of 500 μm was then deposited on the p-type GaN contact layer 29 to provide the p-electrode (not shown). Annealing may alternatively be performed prior to forming the n-electrode, but was performed after the n-electrode was formed in this example. Annealing was performed using the method described in published International Application no. WO 98/37586 of Yamaoka et al., which is assigned to the assignee of this disclosure and is incorporated herein by reference.

After the n-electrode and the p-electrode were formed, the substrate and the stack of layers were cleaved to form individual lasers each having a cavity structure. Some of the individual lasers were used as test samples of a laser diode incorporating the nitride semiconductor device according to the invention. The results of tests performed on such samples will be described below.

In addition, test samples of the conventional laser diode 10 shown in FIG. 1 were fabricated. The GaN low-temperature-deposited buffer layer 12 was deposited on the sapphire substrate 11, and the n-type GaN n-contact layer 13 was grown on the buffer layer 12. The n-type AlGaN cladding layer 14 with an AlN molar fraction of 5% was grown to a thickness of 500 nm directly on the n-type GaN n-contact layer 13 without any buffer layer between the layers. The p-type AlGaN cladding layer 18 with the same molar fraction and thickness as the n-type AlGaN cladding was grown on the p-type optical waveguide layer 17. The optical waveguide layers 15 and 17, the p-contact layer 19, and active layer 16 were formed in the same manner as in the example described above.

Figure 4:
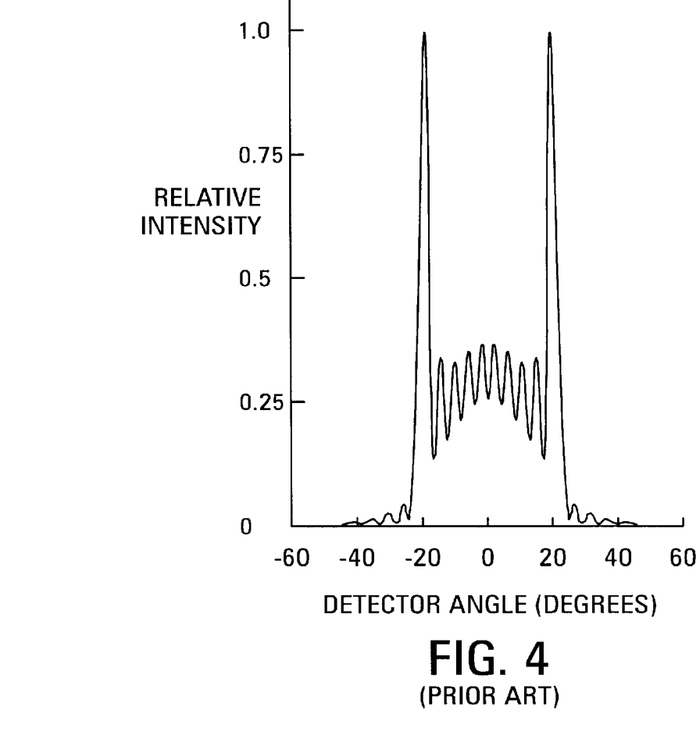
FIG. 4 is a graph showing the far-field pattern of the coherent light generated by the conventional laser diode shown in FIG. 1.

The test samples of the conventional laser diode 10 had a threshold current of approximately 300 mA, and the coherent light emitted by the test samples had a far-field pattern that exhibited multiple peaks, as shown in FIG. 4. In FIG. 4, the rotational angle of the laser diode with respect to the photodetector is plotted along the x-axis, and the optical intensity is plotted along the y-axis.

The above-mentioned test samples of the laser diode 20 incorporating the nitride semiconductor device according to the invention had a threshold current of 150 mA, or approximately half that of the test samples of the conventional laser diode 10. It was also found that the test samples of the laser diode incorporating the nitride semiconductor device according to the invention generated light with a far-field pattern that exhibited a clean single peak, as shown in FIG. 3.

Figure 5:
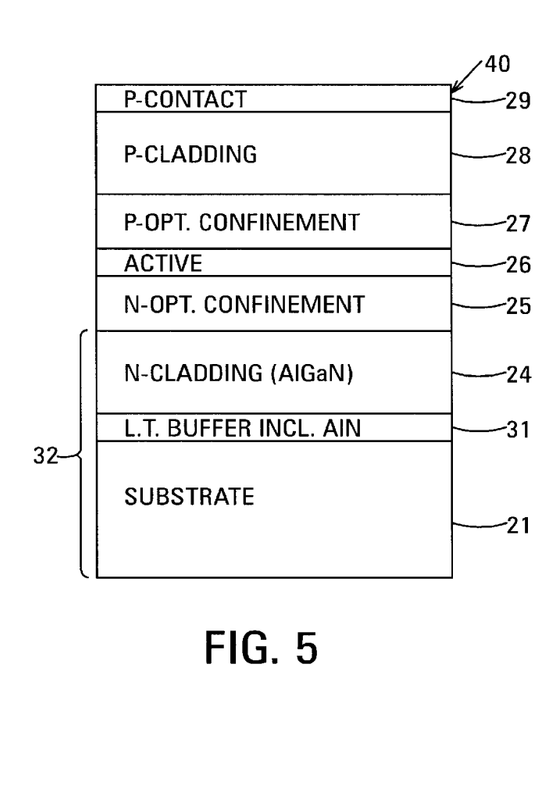
FIG. 5 is a schematic drawing showing the structure of a second embodiment of a laser diode incorporating the nitride semiconductor device according to the invention.

FIG. 5 shows the structure of a second embodiment 40 of a laser diode that incorporates a nitride semiconductor device according to the invention. Elements of the second embodiment that correspond to elements of the first embodiment shown in FIG. 2 are indicated using the same reference numerals and will not be described further. The second embodiment differs from the first embodiment in that the buffer layer 30 of low-temperature-deposited nitride semiconductor material and the n-type GaN n-contact layer 23 are omitted. In this embodiment, the nitride semiconductor device 32 is composed of the buffer layer 31 of low-temperature-deposited nitride semiconductor material that includes AlN sandwiched between the sapphire substrate 21 and the 1 μm-thick n-type Al$_{0.1}$Ga$_{0.9}$N cladding layer 24.

A stack of layers is grown on the substrate as described above, except that the buffer layer 30 of low-temperature-deposited nitride semiconductor material and the n-type GaN layer 23 are omitted and the buffer layer 31 of low-temperature-deposited nitride semiconductor material that includes AlN is deposited directly on the substrate 21. The n-electrode (not shown) is formed by etching the stack to expose the n-type AlGaN cladding layer 24. An n-electrode of Ti/Au is then vapor deposited on the surface thus exposed. Processing following the deposition of the n-electrode is the same as that described above. After the electrodes have been formed, the stack of layers and the substrate are cleaved to form individual lasers each having a cavity structure.

Test samples of the second embodiment 40 of a laser diode incorporating the nitride semiconductor device according to the invention had a threshold current of 160 mA. This is similar to that of the test samples of the above-described first embodiment 20 of a laser diode incorporating the nitride semiconductor device according to the invention. The far-field pattern of the light generated by the second embodiment of the laser diode also exhibited a clean, single peak.

Figure 6:
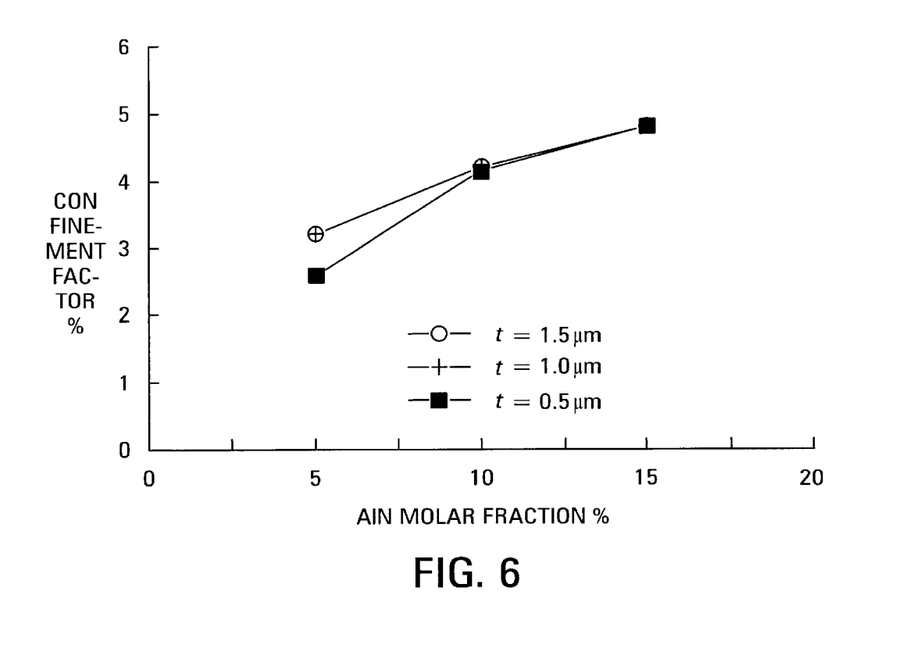
FIG. 6 is a graph showing the effect of varying the AlN molar fraction and the thickness of the AlGaN cladding layers on the optical confinement factor of a laser diode incorporating the nitride semiconductor device according to the invention.
Figure 7:
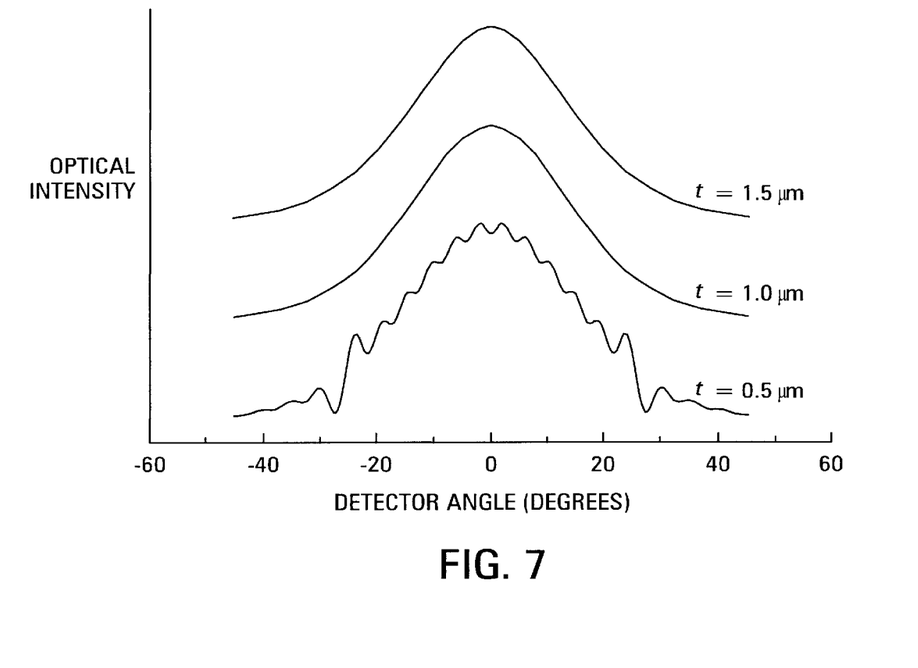
FIG. 7 is a graph showing the effect of varying the thickness of the AlGaN cladding layers on the far-field pattern of light generated by a laser diode incorporating the nitride semiconductor device according to the invention.

FIG. 6 shows the effect of varying the AlN molar fraction and the thickness of the AlGaN cladding layers on the optical confinement factor of a laser diode incorporating the nitride semiconductor device according to the invention. FIG. 7 shows the effect of varying the thickness of the AlGaN cladding layers on the far-field pattern of light generated by a laser diode incorporating the nitride semiconductor device according to the invention in which the AlN molar fraction in the AlGaN of the cladding layers was 10%. The results shown were obtained from test samples in which variations (if any) in the AlN molar fraction and the thickness of the n-type AlGaN cladding layer 24 and the p-type AlGaN cladding layer 28 were substantially similar.

FIG. 6 is a graph in which the AlN molar fraction, expressed as a percentage, is plotted along the x-axis and the optical confinement factor, also expressed as a percentage, is plotted along the y-axis. Changes in the optical confinement factor in response to varying the AlN molar fraction are plotted for three different values of the thickness t of the AlGaN cladding layers 24 and 28, namely, 0.5 $\mu$m, 1 $\mu$m, and 1.5 $\mu$m.

FIG. 7 is a graph in which the rotational angle of the laser diode relative to the photodetector is plotted along the x-axis, and optical intensity is plotted along the y-axis. Optical intensities at the different detector angles are plotted for three different values of the thickness t of the AlGaN cladding layers 24 and 28, namely, 0.5 $\mu$m, 1 $\mu$m, and 1.5 $\mu$m. The AlN molar fraction in the AlGaN of the cladding layers 24 and 28 of the test samples was 10%. The curves shown in FIG. 7 are offset from one another in the y-direction to enable them to be seen more easily.

FIGS. 6 and 7 show that a large optical confinement factor is obtained and the far-field pattern has only a single peak when the AlN molar fraction of the cladding layers is 10% or more and the thickness of the cladding layers is 1 $\mu$m or more.

FIG. 6 shows that, when the AlN molar fraction is 10% or more, there is substantially no difference in the optical confinement factor regardless of whether the thickness of the cladding layer is 0.5 $\mu$m or 1 $\mu$m. However, FIG. 7 shows a clear difference in the far-field pattern between cladding layers that are 0.5 $\mu$m thick and cladding layers that are 1 $\mu$m thick. Therefore, the far-field pattern can be used as a practical way to determine the thickness and AlN molar fraction of the cladding layers.

Figure 8:
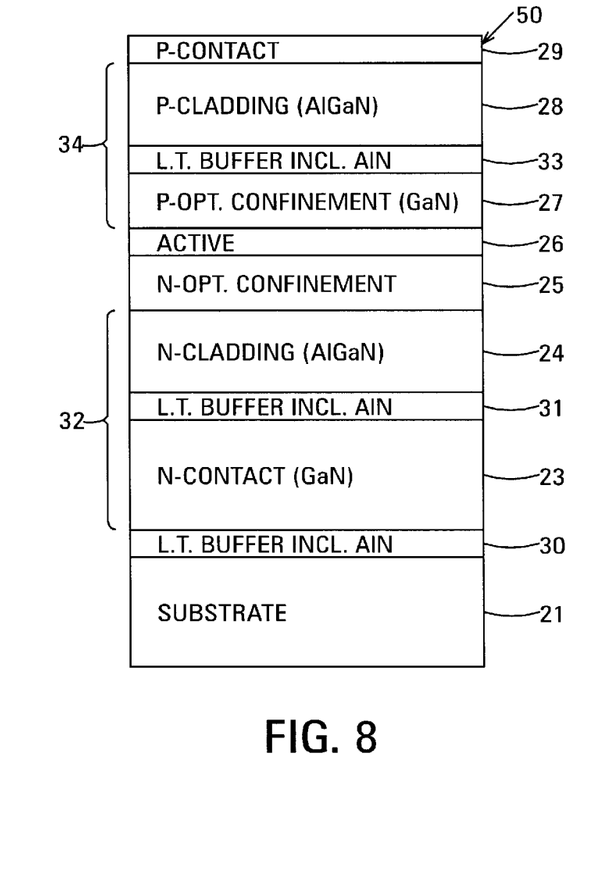
FIG. 8 is a schematic drawing showing the structure of a third embodiment of a laser diode incorporating two nitride semiconductor devices according to the invention.

The above-described embodiments of the laser diode incorporate a single nitride semiconductor device 32 according to the invention. These embodiments lack a buffer layer of low-temperature-deposited nitride semiconductor material that includes AlN sandwiched between the p-type GaN optical waveguide layer 27 and the p-type AlGaN cladding layer 28. FIG. 8 shows a third embodiment 50 of a laser diode that incorporates two nitride semiconductor devices according to the invention. Elements of the laser diode 50 that correspond to elements of the laser diode 20 shown in FIG. 2 are indicated using the same reference numerals, and will not be described further.

In addition to the nitride semiconductor device 32, the laser diode 50 includes the nitride semiconductor device 34 composed of the buffer layer 33 of low-temperature-deposited AlGaN semiconductor material sandwiched between the p-type GaN optical guiding layer 27 and the p-type AlGaN cladding layer 28. The nitride semiconductor device 34 reduces the possibility of cracking in the p-type AlGaN cladding layer. The buffer layer 33 may be doped with magnesium at a concentration in the range from about $1 \times 10^{18}$ cm$^{-3}$ to $5 \times 10^{20}$ cm$^{-3}$ to make the low-temperature-deposited AlGaN semiconductor material of the buffer layer 33 p-type. In an embodiment, the magnesium concentration was $1 \times 10^{20}$ cm$^{-3}$.

Doping the buffer layer 33 of low-temperature-deposited AlGaN semiconductor material at a higher dopant concentration than the p-cladding layer 28 grown directly on the buffer layer 33 decreases the resistivity of the buffer layer 33.

Metal-organic vapor phase epitaxy (MOVPE) was used to fabricate embodiments of the nitride semiconductor devices according to the invention. However, molecular beam epitaxy (MBE) or halide vapor phase epitaxy (HVPE) may be used instead.

Sapphire and SiC are mentioned above as the materials of the substrate 21. The material of substrate can also be spinel or GaN. Also suitable is the multi-layer substrate described in published International Application no. WO 99/25030 of Amano et al., which is assigned to the assignee of this disclosure and is incorporated herein by reference.

The invention yields a number of advantages. For example, the invention enables AlGaN cladding layers with a thickness of at least 1 $\mu$m and having an AlN molar fraction of at least 10% to be grown without any cracks on a layer of GaN that has a dissimilar lattice constant. This means there is no need for the cladding layers to have a complicated structure such as a superlattice structure.

Also, because the invention enables the easy fabrication of a nitride semiconductor device that can be incorporated into a semiconductor laser that generates light having a far-field pattern with a good, single peak, it enables lasers to be made for use in applications, such as an optical information recording apparatus, that require lasers with such characteristics.

Furthermore, when incorporated into a laser, the nitride semiconductor device according to the invention improves the optical confinement provided by the active layer of the laser. This reduces the threshold current of such lasers and greatly increases the number of potential applications for them.

Moreover, because the nitride semiconductor device according to the invention virtually eliminates cracking in a thick layer of a nitride semiconductor material grown over a layer of another material having a dissimilar lattice constant, the manufacturing yield of semiconductor devices incorporating the nitride semiconductor device according to the invention is greatly increased, which leads to significant reductions in manufacturing costs.

Since the nitride semiconductor device according to the invention provides a thick, virtually crack-free layer of a single-crystal nitride semiconductor material including AlN grown over a layer of another material having a dissimilar lattice constant, with a buffer layer sandwiched between the layers, the nitride semiconductor device can form the basis not only of the laser diodes described above, but also of other semiconductor devices that have a heterostructure that includes adjacent thick layers of Group III-nitride semiconductors having different lattice constants. Such devices include photodiodes, light-emitting diodes, surface-emitting lasers, high electron mobility transistors (HEMT), and field-effect transistors (FET).

Although this disclosure describes illustrative embodiments of the invention in detail, it is to be understood that the invention is not limited to the precise embodiments described, and that various modifications may be practiced within the scope of the invention defined by the appended claims.

We claim:

1. A nitride semiconductor device, comprising:
   a first layer;
   a second layer of a single-crystal nitride semiconductor material including AlN, the second layer having a thickness greater than a thickness at which cracks would form if the second layer were grown directly on the first layer; and
   a buffer layer of a low-temperature-deposited nitride semiconductor material including AlN, the buffer layer being sandwiched between the first layer and the second layer.

2. The nitride semiconductor device of claim 1, in which:
   the nitride semiconductor device is a component of a semiconductor laser; and
   at least one of (a) the thickness of the second layer, and (b) a molar fraction of the AlN in the single-crystal nitride semiconductor material including AlN is greater than a value at which coherent light emitted by the semiconductor laser has a far field pattern exhibiting a single peak.

3. The nitride semiconductor device of claim 1, in which the first layer is a substrate including a material selected from a group consisting of sapphire, silicon carbide and gallium nitride.

4. The nitride semiconductor device of claim 1, in which the first layer consists essentially of gallium nitride.

5. The nitride semiconductor device of claim 4, in which:
   the buffer layer is a first buffer layer;
   the nitride semiconductor device additionally comprises:
      a substrate, and
      a second buffer layer of a low-temperature-deposited nitride semiconductor material including AlN, the second buffer layer being sandwiched between the substrate and the first layer; and
   the first layer is grown on the second buffer layer.

6. The nitride semiconductor device of claim 1, in which:
   the buffer layer has a thickness in a range from 2 nm to 100 nm;
   the low-temperature-deposited nitride semiconductor material including AlN consists essentially of $Al_yGa_{1-y}N$ ($0<y\leq 1$);
   the second layer has a thickness greater than 600 nm; and
   the single-crystal nitride semiconductor material including AlN consists essentially of $Al_xGa_{1-x}N$ ($0.05<x\leq 1$).

7. The nitride semiconductor device of claim 1, in which the low-temperature-deposited nitride semiconductor material including AlN has a molar fraction of AlN of at least 5%.

8. The nitride semiconductor device of claim 1, in which:
   the buffer layer is a first buffer layer;
   the nitride semiconductor device additionally comprises:
      a substrate, and
      a second buffer layer of a low-temperature-deposited nitride semiconductor material including AlN, the second buffer layer being sandwiched between the substrate and the first layer; and
   the first layer is grown on the second buffer layer.

9. The nitride semiconductor device of claim 8, in which the single-crystal nitride semiconductor material including AlN has a molar fraction of AlN of at least 10%.

10. A semiconductor laser including at least one of the nitride semiconductor device of claim 1, in which the second layer of the nitride semiconductor device constitutes a cladding layer of the semiconductor laser.

11. A method of making a nitride semiconductor device, the method comprising:
   providing a first layer;
   depositing on the first layer a buffer layer of a nitride semiconductor material including AlN, the buffer layer being deposited at a temperature below that at which single crystal growth occurs;
   growing a second layer of a single-crystal nitride semiconductor material including AlN on the buffer layer, the second layer being grown at a temperature above that at which single-crystal growth occurs and being grown to a thickness greater than a thickness at which cracks would form if the second layer were grown directly on the first layer.

12. The method of claim 11, in which:
   the nitride semiconductor device is a component of a semiconductor laser diode; and
   growing the second layer includes setting at least one of (a) the thickness of the second layer, and (b) a molar fraction of the AlN in the single-crystal nitride semiconductor material including AlN to greater than a value at which coherent light emitted by the semiconductor laser diode has a far field pattern exhibiting a single peak.

13. The method of claim 11, in which, in providing the first layer, a substrate including a material selected from a group consisting of sapphire, silicon carbide and gallium nitride is provided.

14. The method of claim 11, in which, in providing the first layer, a first layer consisting essentially of gallium nitride is provided.

15. The method of claim 14, in which:
   in depositing the buffer layer, a first buffer layer is deposited;
   the method additionally comprises:
      providing a substrate, and
      depositing on the substrate a second buffer layer of a nitride semiconductor material including AlN, the second buffer layer being deposited at temperature below that at which single-crystal growth occurs; and
   providing the first layer includes growing the first layer on the second buffer layer at a temperature above that at which single-crystal growth occurs.

16. The method of claim 11, in which:
   in depositing the buffer layer:
      the buffer layer is deposited to a thickness in a range from 2 nm to 100 nm, and
      the low-temperature-deposited nitride semiconductor material including AlN consists essentially of $Al_yGa_{1-y}N$ ($0<y\leq 1$); and
   in growing the second layer:
      the second layer is grown to a thickness greater than 600 nm, and
      the single-crystal nitride semiconductor material including AlN consists essentially of $Al_xGa_{1-x}N$ ($0.05<x\leq 1$).

17. The method of claim 11, in which, in depositing the buffer layer, the low-temperature-deposited nitride semiconductor material including AlN has a molar fraction of AlN of at least 5%.

18. The method of claim 17, in which, in depositing the buffer layer, the single-crystal nitride semiconductor material including AlN has a molar fraction of AlN of at least 10%.

19. The method of claim 11, in which:

in depositing the buffer layer, a first buffer layer is deposited;

the method additionally comprises:

providing a substrate, and depositing on the substrate a second buffer layer of a nitride semiconductor material including AlN, the second buffer layer being deposited at temperature below that at which single-crystal growth occurs; and providing the first layer includes growing the first layer on the second buffer layer at a temperature above that at which single-crystal growth occurs.

20. A method for fabricating a semiconductor laser diode, including performing the method of claim 11 to form a cladding layer of the semiconductor laser diode as the second layer.

* * * * *